United States Patent
Nayak et al.

(10) Patent No.: US 9,685,529 B1
(45) Date of Patent: Jun. 20, 2017

(54) III-V NFETS INCLUDING CHANNEL BARRIER LAYERS TO REDUCE BAND-TO-BAND LEAKAGE CURRENT

(71) Applicant: GLOBALFOUNDRIES Inc., Grand Cayman (KY)

(72) Inventors: Deepak Nayak, Fremont, CA (US); Zoran Krivokapic, Santa Clara, CA (US); Srinivasa Banna, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/189,476

(22) Filed: Jun. 22, 2016

(51) Int. Cl.
  *H01L 21/768* (2006.01)
  *H01L 29/66* (2006.01)
  *H01L 23/532* (2006.01)

(52) U.S. Cl.
  CPC .. *H01L 29/66522* (2013.01); *H01L 21/76867* (2013.01); *H01L 23/53271* (2013.01); *H01L 29/6656* (2013.01); *H01L 29/66795* (2013.01)

(58) Field of Classification Search
  CPC ................................................ H01L 29/66522
  See application file for complete search history.

(56) References Cited

U.S. PATENT DOCUMENTS

2007/0082415 A1\* 4/2007 Jeon .................. H01L 21/28088
                                                          438/3
2016/0111496 A1\* 4/2016 Leobandung ....... H01L 29/1033
                                                          257/192

OTHER PUBLICATIONS

Radosavljevic et al., "Advanced High-K Gate Dielectric for High-Performance Short-Channel In0.7Ga0.3As Quantum Well Field Effect Transistors on Silicon Substrate for Low Power Logic Applications", 2009 IEEE International Conference: Electron Devices Meeting, Dec. 7-9, 2009, retrieved on Apr. 27, 2016 from http://www.intel.se/content/dam/doc/technology-brief/high-k-gate-dielectric-short-channel-qwfet-paper.pdf, 4 Pages.

Lee et al., "Record Ion (0.50 mA/μm at VDD=0.5 V and Ioff=100 nA/μm) 25 nm-Gate-Length ZrO2/InAs/InAlAs MOSFETs", Article in Digest of Technical Papers—Symposium on VLSI Technology, Jun. 9-12, 2014, retrieved on Apr. 27, 2016 from http://www.ece.ucsb.edu/Faculty/rodwell/publications_and_presentations/publications/2014_6_10_Lee_VLSI_digest.pdf, 2 Pages.

Cheng et al., "Sub-100 nm Gate III-V MOSFET for Digital Applications", Chapter 10: Fundamentals of III-V Semiconductor MOSFETs, Mar. 16, 2010, 21 Pages.

\* cited by examiner

*Primary Examiner* — Caleb Henry
*Assistant Examiner* — Mounir Amer
(74) *Attorney, Agent, or Firm* — Ditthavong & Steiner, P.C.

(57) ABSTRACT

Methods for creating barrier layers in a III-V electron channel to reduce band-to-band leakage current and the resulting devices are disclosed. Embodiments include forming a fin channel portion comprising a III-V material, on a barrier layer; forming undoped InP semiconductor spacers at opposite ends of the fin channel portion on the barrier layer; forming S/D regions adjacent the undoped InP semiconductor spacers on the barrier layer; and forming a high-k/metal gate over the fin channel portion and undoped InP semiconductor spacers.

13 Claims, 6 Drawing Sheets

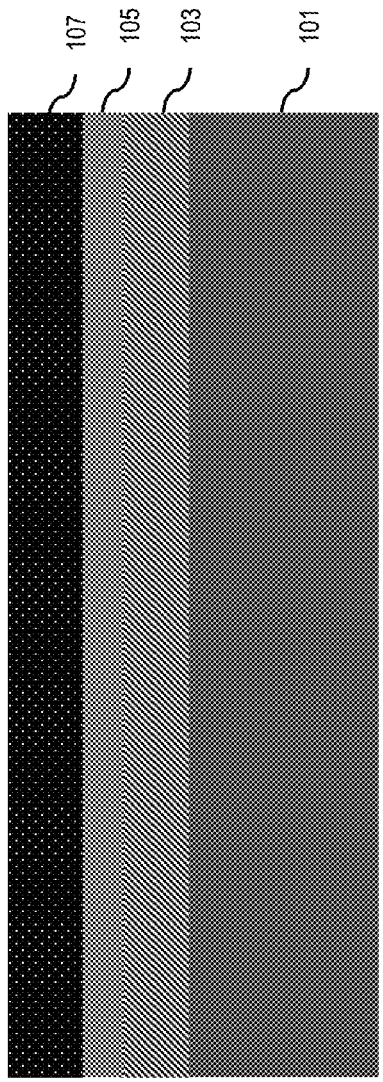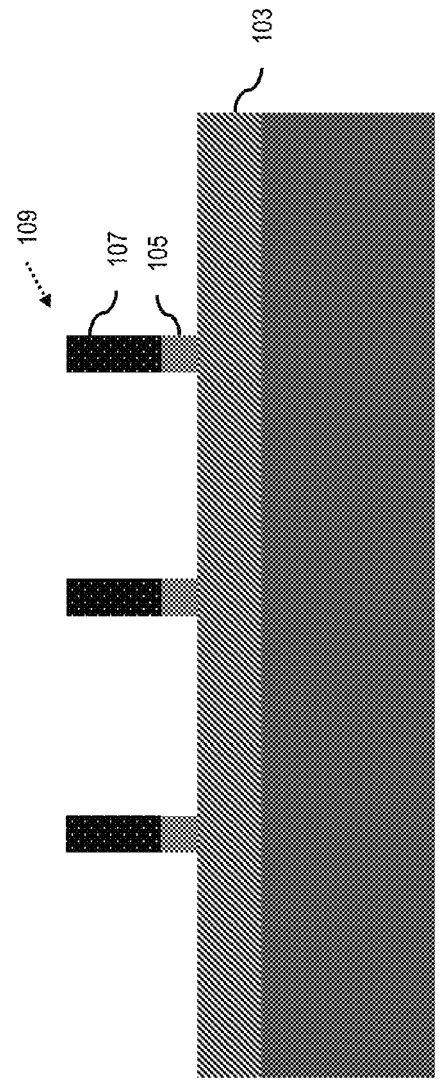

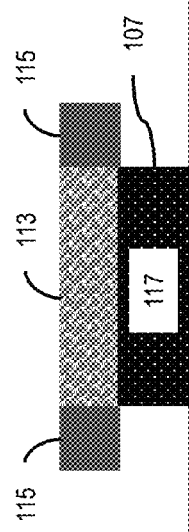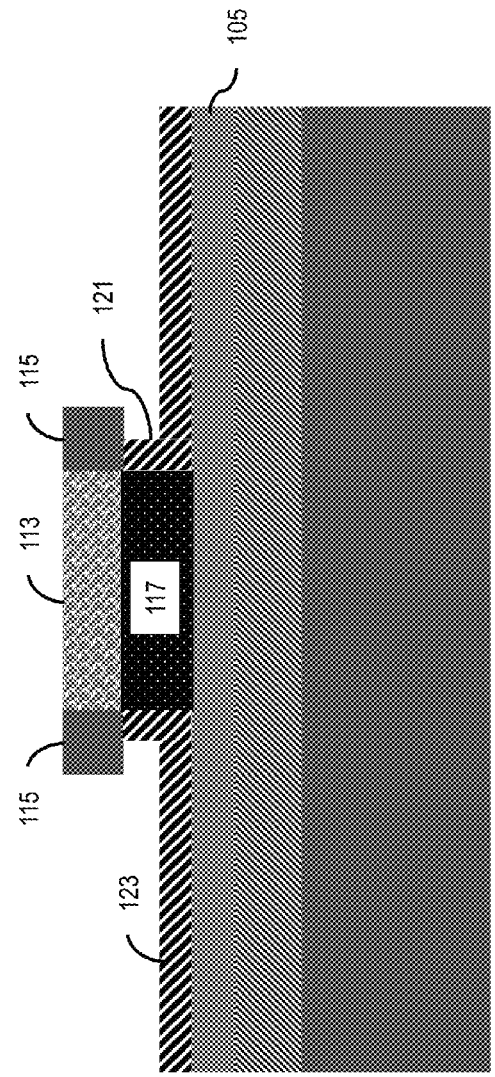

III-V NFETS INCLUDING CHANNEL BARRIER LAYERS TO REDUCE BAND-TO-BAND LEAKAGE CURRENT

TECHNICAL FIELD

The present disclosure relates generally to designing and fabricating integrated circuit (IC) devices. The present disclosure is particularly applicable to n-channel field-effect transistors (NFET) including III-V semiconductor materials in the 7 nanometer (nm) technology node and beyond.

BACKGROUND

Advanced semiconductor materials and/or fabrication processes may be utilized to produce smaller-sized IC devices with better performance and energy efficiency. Semiconductor materials from groups III and V (III-V material/compound) of the periodic table, such as gallium-arsenide (GaAs) or indium-gallium-arsenide (InGaAs), have higher electron mobility/velocity properties when compared to silicon (Si). A III-V compound n-channel allows for a higher current flow between the source and drain regions of a transistor. However, a conventional III-V compound, such as $In_{0.53}Ga_{0.47}As$, has a small bandgap (e.g. 0.73 eV compared to 1.12 eV for Si) that causes higher band-to-band electron tunneling, i.e. higher leakage current, leading to higher power consumption and degraded performance.

Therefore, a need exists for a methodology enabling formation of a III-V high mobility electron channel with reduced band-to-band leakage current and the resulting device.

SUMMARY

An aspect of the present disclosure is a method for creating barrier layers in a III-V electron channel to reduce band-to-band leakage current.

Another aspect of the present disclosure is a device including barrier layers in a III-V electron channel to reduce band-to-band leakage current.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming a fin channel portion including a III-V material, on a barrier layer; forming undoped indium-phosphide (InP) semiconductor spacers at opposite ends of the fin channel portion on the barrier layer; forming source/drain (S/D) regions adjacent the undoped InP semiconductor spacers on the barrier layer; and forming a high-k/metal gate over the fin channel portion and undoped InP semiconductor spacers.

Another aspect includes forming the fin channel portion of undoped InGaAs.

A further aspect includes forming the semiconductor spacers to a thickness of 2 to 6 nm.

One aspect includes forming undoped or graded-doping InGaAs S/D layers with a thickness of 1 to 6 nm between the semiconductor spacers and the S/D regions.

An additional aspect includes forming the InGaAs S/D regions of highly doped n-type InGaAs adjacent the undoped InGaAs S/D layers.

Another aspect includes forming the high-k/metal gate between low-k spacers of silicon-nitride or silicon-oxide.

A further aspect includes forming the barrier layer of indium-aluminum-arsenide (InAlAs).

One aspect includes forming the fin channel portion and/or the barrier layer by metal organic chemical vapor deposition (MOCVD) or molecular beam epitaxy (MBE).

Another aspect of the present disclosure includes a device including: a fin channel portion including a III-V material, on a barrier layer; undoped indium-phosphide InP semiconductor spacers at opposite ends of the fin channel portion on the barrier layer; S/D regions adjacent the undoped InP semiconductor spacers on the barrier layer; and a high-k/metal gate over the fin channel portion and undoped InP semiconductor spacers.

In one aspect, the fin channel portion is formed of undoped InGaAs.

In a further aspect, the semiconductor spacers have a thickness of 2 to 6 nm.

In an additional aspect, undoped InGaAs S/D layers with a thickness of 1 to 6 nm are formed between the semiconductor spacers and the S/D regions.

In another aspect, the S/D regions of highly doped n-type InGaAs are formed adjacent the undoped InGaAs S/D layers.

In one aspect, the high-k/metal gate is formed between low-k spacers of silicon-nitride or silicon-oxide.

In another aspect, the barrier layer is formed of InAlAs.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1D illustrate cross-sectional views of material layers on a substrate, and in accordance with an exemplary embodiment; and FIGS. 1E through 1L illustrate cross-sectional views of the material layers on the substrate along a fin, and in accordance with an exemplary embodiment.

DETAILED DESCRIPTION

Figure 1C:
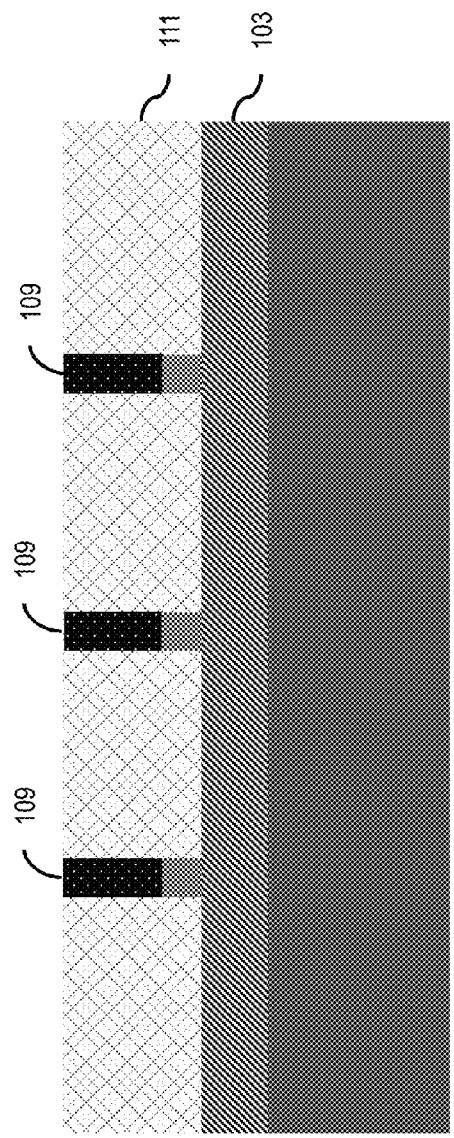

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses the problem of high band-to-band leakage current attendant upon forming an electron channel of a FinFET device of a III-V material. The present disclosure addresses and solves such a problem, for instance, by, inter alia, introducing a thin (2 to 6 nm) undoped semiconductor InP barrier with a large band-gap (e.g. 1.35 eV) between the channel and S/D regions of the device to suppress band-to-band tunneling of electrons, hence, reducing leakage current.

FIG. 1A illustrates a substrate 101, a buffer layer 103, a barrier layer 105, and a fin layer 107 conformally formed on an upper surface of the substrate 101. The substrate 101 material may be InP or Si. The buffer 103 material may be a III-V compound such as InAlAs for an InP substrate 101, or GaAs for an Si substrate 101. The barrier layer 105 material may be InAlAs, and the fin layer 107 material may be InGaAs. The fin layer 107 may be undoped InGaAs. The fin channel layer 107 and/or the barrier layer 105 may be formed by MOCVD or MBE.

In FIG. 1B, sections of the fin 107 and barrier 105 layers are removed to form fin structures 109, including a fin layer 107 over the barrier layer 105, on an upper surface of the buffer layer 103.

Adverting to FIG. 1C, interlayer dielectric (ILD) 111 is formed filling spaces between the fin structures 109 down to an upper surface of the buffer layer 103.

Figure 1D:
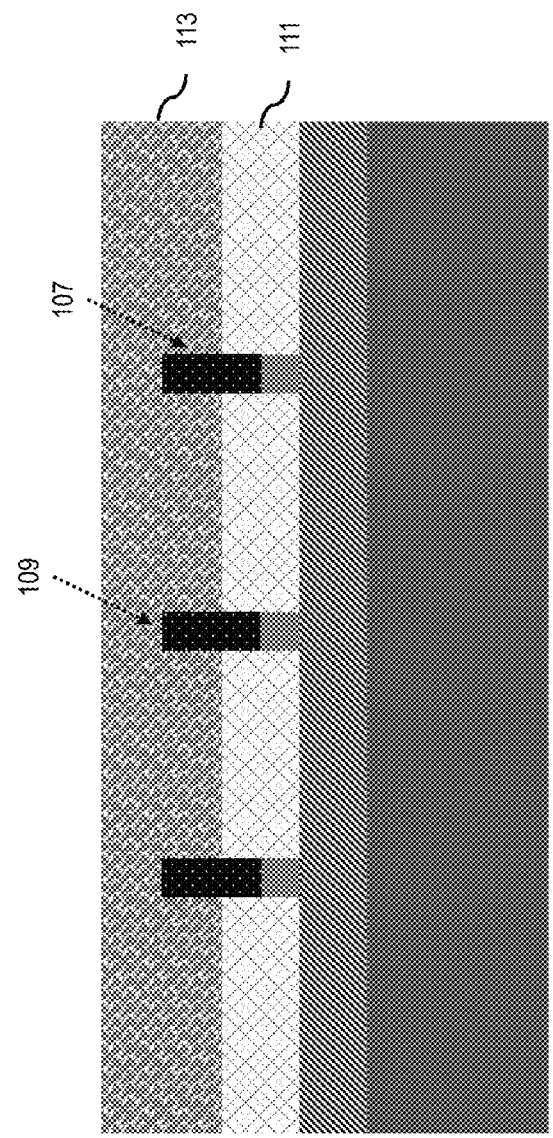

In FIG. 1D, a portion of the ILD 111 is removed down to a level exposing upper sections of the fin layers 107 of the fin structures 109. Next, dummy gates 113 are formed over and between channel regions/portions of the fin layers 107.

Figure 1E:
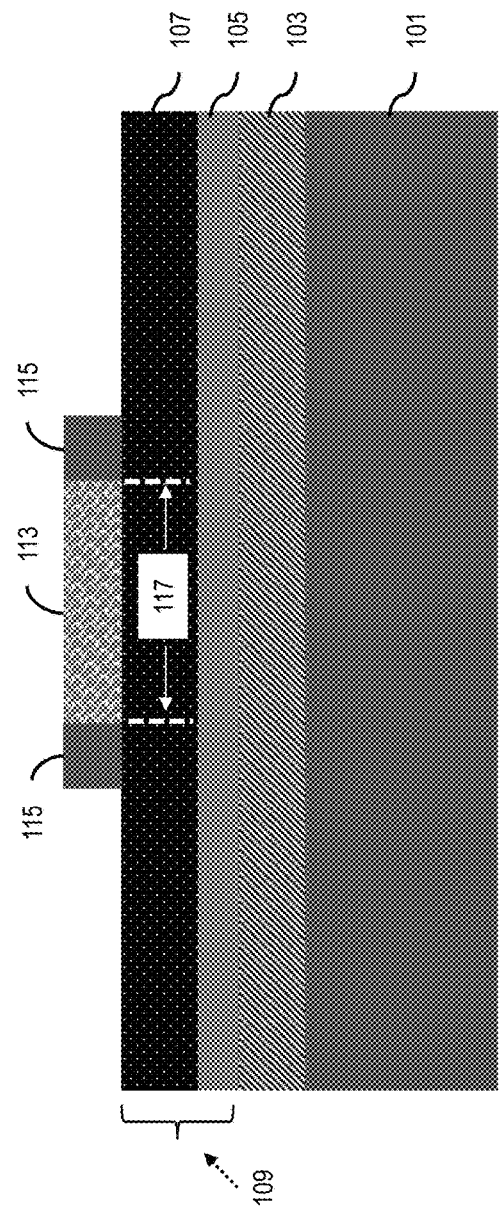

FIG. 1E shows a cross-sectional view along the length of fin 107. As illustrated in FIG. 1E, low-k spacers 115 (e.g., silicon-nitride, silicon-oxide) are formed on opposite sides of the dummy gates 113 over the fin channel portions 117.

Figure 1F:
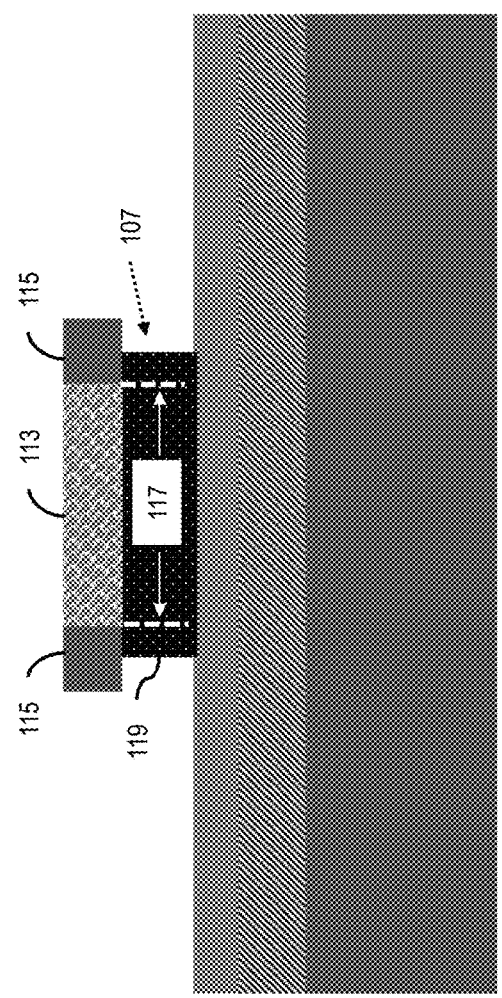

In FIG. 1F, exposed sections of the fin layers 107 are removed leaving segments including fin channel portions 117 and adjacent sections 119 under the spacers 115.

Adverting to FIG. 1G, additional sections of exposed sides of the fin layers 107 are removed leaving the fin channel portions 117 under the dummy gate area 113.

Figure 1I:
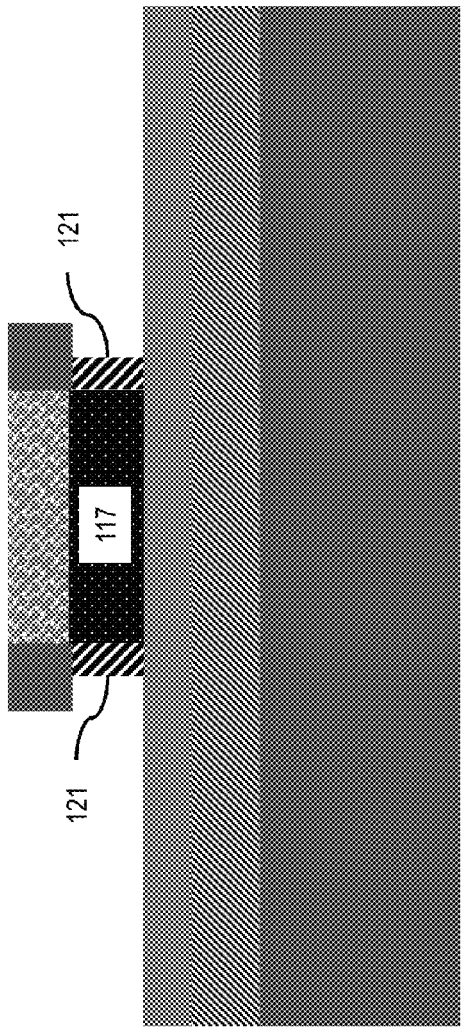

In FIG. 1H, undoped InP semiconductor spacers 121 are formed on exposed sides of fin channel portions 117. If the InP barrier is too thin, it will be ineffective in suppressing band-to-band tunneling, and if it is too thick, it will degrade the drive current drive (Idsat) by increasing Drain to Source resistance. Therefore, the spacers 121 may have a thickness of 2 to 6 nm. It is possible that a layer 123 of the semiconductor spacers 121 may be formed on the upper surface barrier layer 105, but the layer 123 may be removed as illustrated in FIG. 1I, leaving vertical semiconductor spacers 121 on the sides of the fin channel portions 117.

Figure 1J:
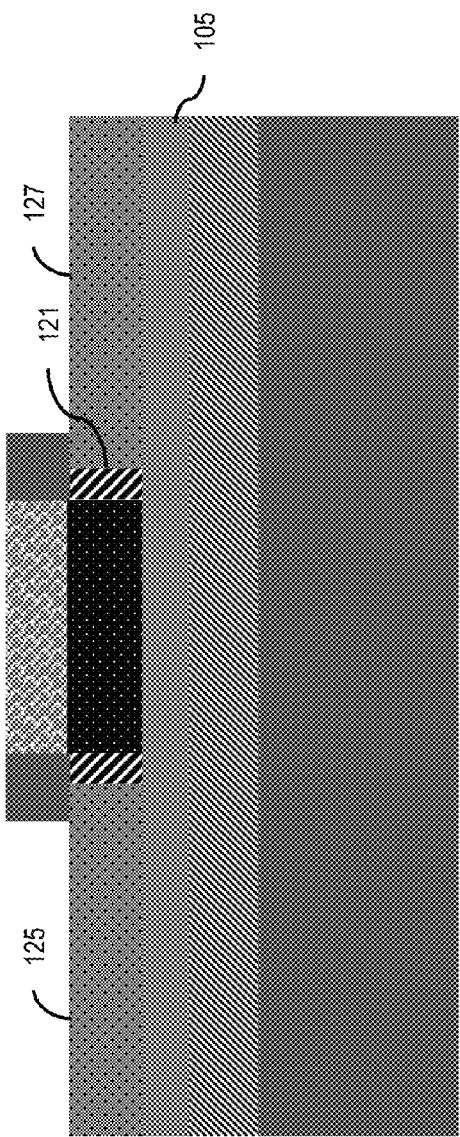

Adverting to FIG. 1J, S/D regions 125 and 127 of highly doped n-type InGaAs are formed adjacent the vertical semiconductor spacers 121 and on the upper surface of the barrier layer 105. For example, S/D regions 125 and 127 may be doped with an n-type dopant such as Si at a concentration of 1E19 to 5E20.

Figure 1K:
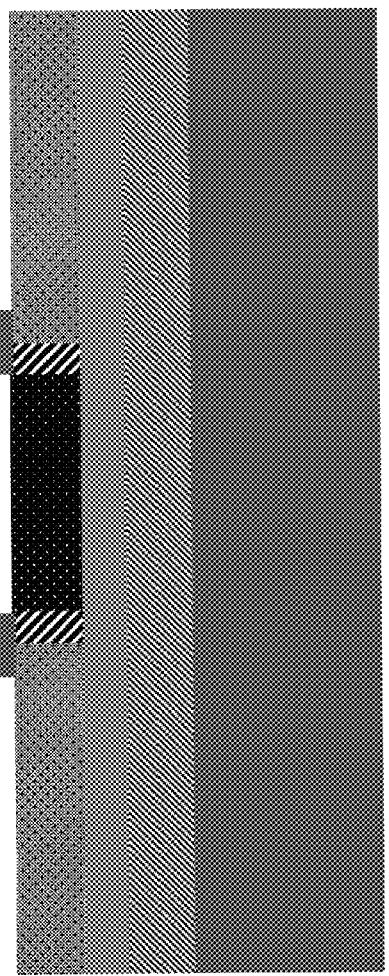

In FIG. 1K, the dummy gates are removed creating cavities 129 between the low-k spacers 115.

Figure 1L:
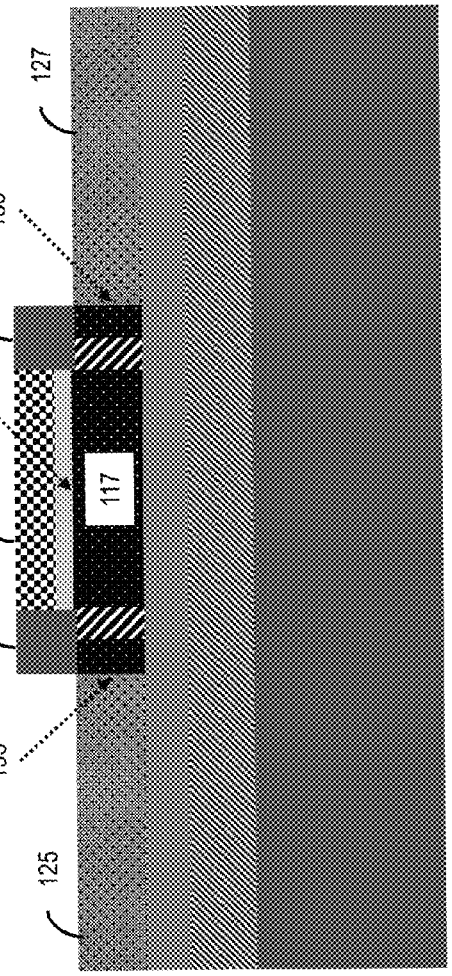

As illustrated in FIG. 1L, high-k gate dielectric 131 and metal gates 133 are formed between the low-k spacers 115. To further reduce band-to-band tunneling, sections 135 of the S/D regions 125/127 may be formed of undoped or graded-doping InGaAs (e.g. similar to the fin channel portions 117) with a thickness of 1 to 6 nm prior to forming the highly doped regions 125/127. Sections 135 may be part of their respective S/D regions 125/127, wherein sections 135 are undoped or graded-doping InGaAs and the S/D regions 125/127 are highly doped InGaAs (e.g. in-situ). In case of a graded-doping, a doping level may be lower in the sections 135 close to the InP barrier side and higher towards the S/D regions 125/127. The S/D regions 125/127 may include the sections 135 (e.g. effectively no sections 135) or sections 135 may be omitted.

The embodiments of the present disclosure can achieve several technical effects including reducing band-to-band leakage current in an n-channel FinFET device by including a thin undoped InP barrier layer and an undoped S/D InGaAs layer between the n-channel and adjacent S/D regions. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.), particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a fin channel portion comprising a III-V material, on a barrier layer;
    forming undoped indium-phosphide (InP) semiconductor spacers at opposite ends of the fin channel portion on the barrier layer;
    forming source/drain (S/D) regions adjacent the undoped InP semiconductor spacers on the barrier layer;
    forming a high-k/metal gate over the fin channel portion and undoped InP semiconductor spacers; and
    forming undoped or graded-doping InGaAs S/D layers between the semiconductor spacers and the S/D regions.

2. The method according to claim 1, comprising:
    forming the fin channel portion of undoped indium-gallium-arsenide (InGaAs).

3. The method according to claim 1, comprising:
    forming the semiconductor spacers to a thickness of 2 to 6 nanometer (nm).

4. The method according to claim 1, wherein the undoped or graded-doping InGaAs S/D layers are formed with a thickness of 1 to 6 nm.

5. The method according to claim 4, comprising:
    forming the S/D regions of highly doped n-type InGaAs adjacent the undoped or graded-doping InGaAs S/D layers.

6. The method according to claim 1, comprising:
    forming the high-k/metal gate between low-k spacers of silicon-nitride or silicon-oxide.

7. The method according to claim 1, comprising:
forming the barrier layer of indium-aluminum-arsenide (InAlAs).

8. The method according to claim 1, comprising:
forming the fin channel portion and/or the barrier layer by metal organic chemical vapor deposition (MOCVD) or molecular beam epitaxy (MBE).

9. A method comprising:
forming a fin channel portion of undoped indium-gallium-arsenide (InGaAs), on a barrier layer;
forming undoped indium-phosphide (InP) semiconductor spacers at opposite ends of the fin channel portion on the barrier layer;
forming source/drain (S/D) regions, of highly doped n-type InGaAs, adjacent the undoped InP semiconductor spacers on the barrier layer;
forming a high-k/metal gate, between low-k spacers of silicon-nitride or silicon-oxide, over the fin channel portion and undoped InP semiconductor spacers; and
forming undoped or graded-doping InGaAs S/D layers between the semiconductor spacers and the S/D regions.

10. The method according to claim 9, comprising:
forming the semiconductor spacers to a thickness of 2 to 6 nanometer (nm).

11. The method according to claim 9, wherein the undoped or graded-doping InGaAs S/D layers are formed with a thickness of 1 to 6 nm.

12. The method according to claim 9, comprising:
forming the barrier layer of indium-aluminum-arsenide (InAlAs).

13. The method according to claim 9, comprising:
forming the fin channel portion and/or the barrier layer by metal organic chemical vapor deposition (MOCVD) or molecular beam epitaxy (MBE).

* * * * *